US006657466B1

United States Patent
Sudjian

(10) Patent No.: US 6,657,466 B1
(45) Date of Patent: Dec. 2, 2003

(54) SYSTEM AND METHOD FOR GENERATING INTERLEAVED MULTI-PHASE OUTPUTS FROM A NESTED PAIR OF PHASE LOCKED LOOPS

(75) Inventor: Douglas Sudjian, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/154,030

(22) Filed: May 23, 2002

(51) Int. Cl.[7] .................................................. H03L 7/06
(52) U.S. Cl. ...................................... 327/158; 327/161
(58) Field of Search .............................. 327/147, 149, 327/152, 153, 156, 158, 161, 270, 271, 284, 295; 331/10, 11, 12, 46, 57, 58

(56) References Cited

U.S. PATENT DOCUMENTS

| | | | | |
|---|---|---|---|---|
| 4,675,617 A | * | 6/1987 | Martin | 331/1 A |
| 5,120,990 A | | 6/1992 | Koker | 327/2 |
| 5,254,959 A | | 10/1993 | Wünsch | 331/12 |
| 5,638,014 A | * | 6/1997 | Kurita | 327/141 |
| 5,675,620 A | * | 10/1997 | Chen | 375/376 |
| 5,717,362 A | * | 2/1998 | Maneatis et al. | 331/57 |
| 5,809,097 A | * | 9/1998 | Lakshmikumar | 375/376 |
| 5,834,950 A | | 11/1998 | Co et al. | 327/12 |
| 6,215,816 B1 | * | 4/2001 | Gillespie et al. | 375/219 |
| 6,259,326 B1 | * | 7/2001 | Dunlop et al. | 331/2 |
| 6,304,116 B1 | | 10/2001 | Yoon et al. | 327/158 |
| 6,456,128 B1 | * | 9/2002 | Nakamura | 327/149 |

OTHER PUBLICATIONS

Sun et al., "A 1.25–GHz 0.35–$\mu$m Monolithic CMOS PLL Based on a Multiphase Ring Oscillator," IEEE Journal of Solid–State Circuits, vol. 36, No. 6, Jun. 2001, pp. 910–916.

Enam et al., "NMOS IC's for Clock and Data Regeneration in Gigabit–per–Second Optical–Fiber Receivers," IEEE Journal of Solid–State Circuits, vol. 27, No. 12, Dec. 1992, pp. 1763–1774.

* cited by examiner

Primary Examiner—Timothy P. Callahan
Assistant Examiner—Cassandra Cox
(74) Attorney, Agent, or Firm—Kevin L. Daffer; Conley Rose P.C.

(57) ABSTRACT

An improved clock generation circuit that utilizes a multi-phase PLL architecture is provided as well as a method for generating multiple phase outputs. The clock generation circuit can produce multiple phase outputs with the oscillator only producing approximately one-half of those multiple phase outputs. The other half of the phase outputs come from a set of delay circuits external to the oscillator. In this fashion, the oscillator can operate at relatively high frequencies yet not suffer the consequences of trying to decrease the tap-to-tap delay using additional series delay elements if numerous phase outputs are needed. Instead, one-half of the taps are provided external to the oscillator. Thus, the phase outputs from the oscillator are interleaved with phase outputs from an external set of delay circuits, where the oscillator is under frequency lock control using a first PLL and the external delay circuits maintain the frequency lock of the oscillator, yet are delayed in phase by virtue of a phase lock control of a second PLL. The combination of dual PLLs ensures consistent phase alignment between the oscillator phase outputs and the external delay circuit phase outputs. Phase control is ensured through the second PLL and, importantly, regularly spaced phase outputs produced in an interleaved fashion can be achieved for high density phase outputs exceeding, for example, 8, 16, or even 32 multiple phase outputs from the PLL circuit.

19 Claims, 7 Drawing Sheets

SYSTEM AND METHOD FOR GENERATING INTERLEAVED MULTI-PHASE OUTPUTS FROM A NESTED PAIR OF PHASE LOCKED LOOPS

BACKGROUND OF THE INVENTION

1. Field of the Invention

This invention relates to a clock generation circuit and, more particularly, a multi-phase, phase-locked loop ("PLL") circuit used for synchronizing an electronic subsystem. The multi-phase PLL circuit can generate a first set of phase outputs interleaved with a second set of phase outputs, one or more of which can be forwarded to an electronic subsystem for synchronization, for example, in a clock and data recovery operation. The circuit preferably includes an oscillator within a first phase-locked loop and a multiple phase delay circuit within a second phase-locked loop, wherein the second phase locked loop induces a linear delay imparted to one or more delay circuits of the second phase-locked loop in order to interleave the phase outputs of the delay circuits with the first set of phase outputs.

2. Description of the Related Art

The following descriptions and examples are not admitted to be prior art by virtue of their inclusion within this section.

Modern high-speed data communication systems typically use internal clock-referenced circuitry. The circuitry is designed to synchronize with, for example, an incoming data stream or reference signal. In most instances, a PLL circuit derives a sampling frequency from locking to the incoming data stream and generating the necessary clocking signals to which the receive circuitry is synchronized. Clock recovery circuits can employ a multi-phase PLL architecture, where the multiple phases' aid in sampling, and in some cases over-sampling a transmitted data stream. By establishing phase coherence between the PLL based clocks and the data, information can be extracted through this synchronous detection method.

In its most basic form, a PLL consists of a phase/frequency detector, a filter, control circuitry, and a variable oscillator. The signal generated by the oscillator is continuously compared against an incoming reference clock signal. The reference clock signal preferably transitions from edges of, for example, the incoming data stream. Once compared, the control circuitry adjusts the oscillator output frequency so that the incoming data stream and the oscillator output are transitioning at the same frequency and ideally in phase with one another. Thus, PLLs can be used for the synchronization and re-timing of transmission input data in the form of clock signals.

Clock recovery circuits employing PLLs often benefit by producing a multi-phase oscillator output. For example, a single-phase oscillator output may transition at the same frequency and phase as the incoming data stream. If, however, the clock recovery is designed to receive higher data-rate frequencies, it can be advantageous to design the receiver architecture using a parallel circuit design approach that permits the majority of the receiver to operate at lower frequencies. The oscillator in the receiver can generate multiple phases which are separated by a fixed phase angle such that if two phases are separated by a fixed phase angle, the data receiver circuits can be clocked at a higher frequency to at least match that of the incoming data stream. Thus, PLLs used for data transceivers in clock recovery applications can benefit from using multi-phase clocks to effectively increase the sampling or synchronization rate of higher input frequency events with lower speed clock signals.

If the oscillator of the PLL can generate multiple phases, a parallel receiver architecture can be designed whereby a higher frequency incoming data stream can be clocked and sampled by a substantially lower frequency sampling clock using multiple phases whereby the effective sampling rate can be very high. This scheme can thereby permit the phase detector to more accurately track the higher bit rate of the incoming data. SONET bit streams may have a bit rate as high as 10 bit/s or even 40 Gbit/s (e.g., SONET/SDH standard OC-192 specifies a transmission rate of 9953.28 Mbit/s, and OC-768 specifies a transmission rate of 39813.12 Mbit/s). Consequently, the PLL and other components of the clock recovery circuit design strike a trade off between a parallel multi-phase architecture operating at lower speed compared to a full-rate, higher-speed design, if in fact the higher-speed single phase output design is even possible.

Unfortunately, it is not always a simple matter to produce multiple phase outputs from an oscillator, especially when the incoming data stream has bit rates in the Gbit/s range. As the number of phase outputs increase, the outputs from each inverter within a long chain of inverters used by an oscillator will have extremely small delay tolerance. For example, if a 45° out-of-phase condition is desired (i.e., an 8-phase oscillator output is needed), then even the slightest process variation used in forming the oscillator will negatively effect the oscillator's ability to produce regularly spaced, 8-phase outputs separated ideally at 45°. The problem is compounded as the number of phase outputs or oscillator frequency increases, thereby causing a conflict between the oscillator speed (or tap-to-tap delay) and the number of phase outputs. Conventional tap-to-tap delay bandwidth necessary to propagate a high-speed signal becomes semiconductor fabrication process limited. Moreover, tap-to-tap delay interpolation using analog techniques proves unreliable at high oscillation frequencies over full semiconductor fabrication process corners.

It would be desirable to introduce a clock generation architecture that can use multi-phase outputs from an oscillator without the aforesaid drawbacks. The desired clock generation circuit can receive a high-speed incoming data stream in excess of several Gbit/s to, for example, 10 Gbit/s. Moreover, the desired clock generation architecture should be designed to utilize an oscillator in a PLL that produces, for example, one-half of the multi-phase outputs, while another portion of the PLL circuit produces the other half of the multi-phase outputs. In this fashion, the tap-to-tap delay within the oscillator can be kept fairly large thereby not unduly taxing the semiconductor fabrication process corners when the oscillator is called upon to operate in the GHz range. In addition to its high speed, high density phase output capability, the desired PLL circuit should beneficially interleave sets of delay outputs, each operating at the same frequency and time delay amount across all process variations. Accordingly, the clock generation circuit, the PLL (and associated oscillator), and the control circuits of the desired electronic subsystem should be formed on the same monolithic substrate using conventional semiconductor fabrication processing techniques—even when called upon to produce a large number of phase outputs and operate at significantly high frequencies.

SUMMARY OF THE INVENTION

The problems outlined above are in large part solved by an improved clock generation circuit and, more particularly, to a PLL architecture that can find application in a clock and data recovery circuit. The PLL circuit includes an oscillator having a first set of delay circuits that can be coupled in a ring topology. The PLL circuit can also include a second set of delay circuits separate and apart from the oscillator. The phase outputs from the second set of delay circuits are delayed with respect to phase outputs from the first set of delay circuits in order for phase outputs from the first and second sets of delay circuits to be interleaved with one another. Accordingly, the combined number of first and second sets of delay circuits produce the requisite number of phase outputs from the clock generation circuit. However, only approximately one-half of the total number of phase outputs can occur from the first set of delay circuits—i.e., the oscillator. If the oscillator is called upon to operate at substantially higher frequencies, then the tap-to-tap delay can be kept fairly large, yet a high density, multi-phase output can be achieved from the combined first and second sets of delay circuits. In other words, instead of, for example, the oscillator producing 12 phase outputs at a tap delay of 30 °, the oscillator need only produce six phase outputs at a tap delay of 60. Minor variations in the overall tap delay will have a lessened effect if, for example, the tap delay within the oscillator was 60 ° rather than 30 °. Thus, process variations can be more easily tolerated.

As part of the clock generation circuit and overall PLL architecture, and attributable to the oscillator, is a first PLL adapted to produce a pair of voltages input to the oscillator for setting a frequency of the oscillator as well as the frequency of each output from the second set of delay circuits. In addition to the first PLL, a second PLL is attributable to the PLL architecture. The second PLL can produce another pair of control input signals to a linear delay network. The delay network is controlled by the second PLL to delay the phase outputs from the second set of delay circuits based on a difference in the pair of control values output from the second PLL. Preferably, the amount by which the linear delay network delays the phase outputs from the second set of delay circuits is a fixed percentage of the frequency of the oscillator. Also, the amount of delay is preferably x. 5, where x equals an integer value. More preferably, each phase output from the second set of delay circuits is equally spaced in phase relationship between corresponding pairs of phase outputs from the first set of delay circuits. In this fashion, the multi-phase outputs from the entire clock generation circuit are equally spaced. However, note that the amount of phase outputs from the second set of delay circuits that are interleaved with respect to the phase outputs from the first set of delay circuits can be greater than one. For example, the amount of incremental delay mentioned previously above can be "x.333" whereby now there will be two extra phases interleaved with respect to every two adjacent phase outputs from the first set of delay circuits. This aspect of the PLL architecture is limited by only the complete design constraints needed in a total clock recovery design.

In order to delay the phase outputs from the second set of delay circuits, a three-input phase detector is used. The three-input phase detector forms a part of the second PLL and provides the second pair of control inputs that vary the amount of delay within the second set of delay circuits relative to the first set of delay circuits. The amount of delay can be controlled by virtue of the relationship of pulse edges and, more particularly, the relationship between a pulse edge from a phase output of the second set of delay circuits and pulse edges from phase outputs of two of the first set of delay circuits. In this manner, the second PLL senses, through a feedback connection, phase outputs (or edges of phase outputs) not only within the second set of delay circuits attributable to the second PLL, but also the first set of delay circuits attributable to the first PLL. Thus, the first and second PLLs are nested, with the three-input phase detector sensing and thereby controlling, a phase output from the second set of delay circuits to be preferably in the middle, between phases, of a pair of phase outputs from the first set of delay circuits.

According to one embodiment, a clock generation circuit is provided. The clock generation circuit uses a PLL architecture that includes an oscillator having a first set of phase outputs. The PLL architecture also includes a set of delay circuits having a second set of phase outputs separate from, yet interleaved with, the first set of phase outputs.

According to yet another embodiment, the clock generation circuit includes a first set of delay circuits coupled in a ring and adapted to receive a first pair of differential voltages for setting an oscillation frequency of the ring. The clock generation circuit also includes a phase-locked loop adapted to produce a second pair of differential voltages for incrementally delaying phase outputs from a second set of delay circuits interspersed within and relative to the first set of delay circuits.

According to yet a further embodiment, a method is provided. The method can produce a plurality of phases by producing a first set of phase outputs spaced by a first phase amount. The method also includes delaying a second set of phase outputs approximately one-half the first phase amount and interspersing each of the second set of phase outputs between corresponding pairs of the first set of phase outputs. The combination of producing a first set of phase outputs, delaying, and thereafter producing a second set of phase outputs thereby forms the multi-phase output.

According to still another embodiment, a first PLL and a second PLL are provided. The first PLL sets the oscillation for each of the multi-phase outputs (since the second phase outputs are synchronized and delayed from the first phase outputs). The first PLL employs a feedback loop local only to the first phase outputs. The second PLL synchronizes a phase relationship (or delay) of the second phase outputs relative to the first phase outputs. The second PLL employs a feedback local not only limited to the second phase outputs but also using the first phase outputs. Thus, a phase relationship can be established between the signals in the core oscillating ring (designated as the first PLL) and the delay cell circuits in the second PLL loop.

BRIEF DESCRIPTION OF THE DRAWINGS

Other objects and advantages of the invention will become apparent upon reading the following detailed description and upon reference to the accompanying drawings in which.

Figure 1:
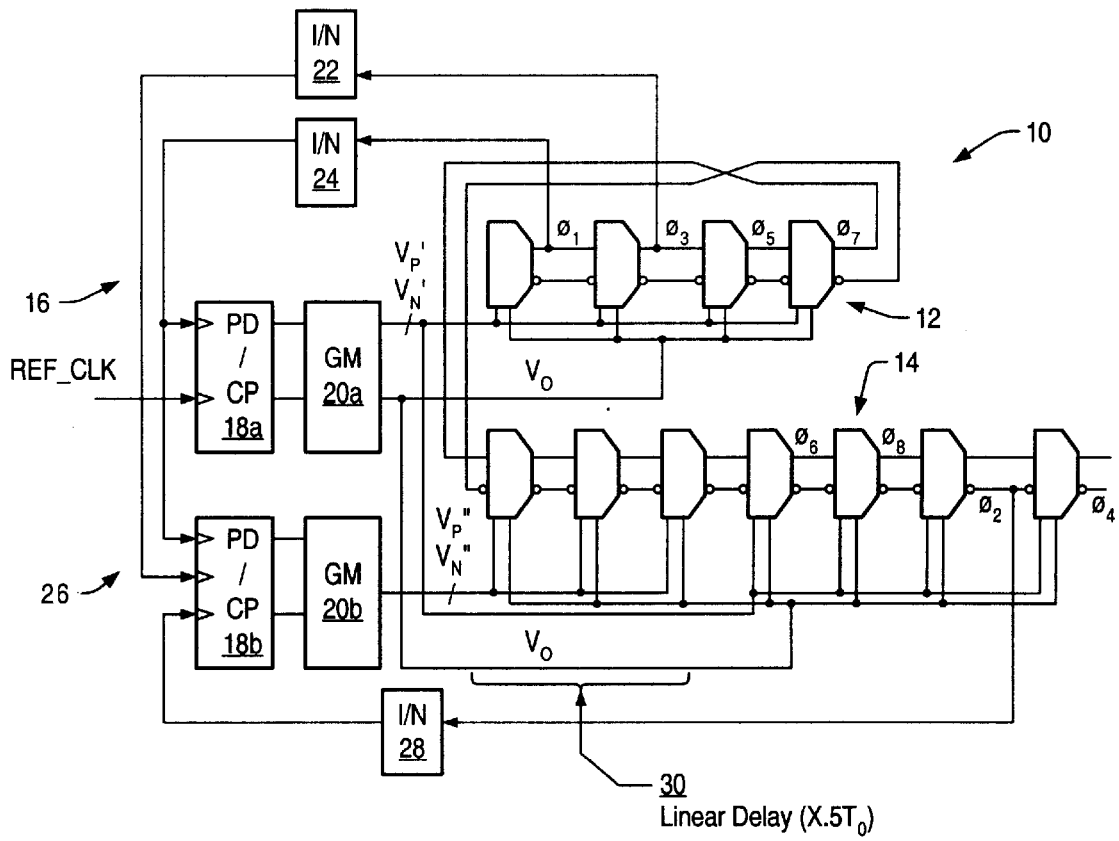
FIG. 1 is a block diagram of a clock generation circuit with PLL architecture using a series-connected set of first delay circuits and second delay circuits for generating a first set of phase outputs and a second set of phase outputs, respectively, where the first set of phase outputs are interleaved with the second set of phase outputs.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a clock generation circuit 10 having a multi-phase output. In the example shown, circuit 10 can produce 8 phases or, more preferably, 16 phases when taking into account each phase of the 8 phases involves a differential output (i.e., ø1 and complementary ø1 being two separate phases). The clock generation circuit 10 shows four phases (ø1, ø3, ø5, and ø7) attributable to an oscillator 12, and another four phases (ø2, ø4, ø6, and ø8) attributable to a second set of delay circuits 14. Oscillator 12 is shown having four delay circuits, hereinafter known as the first set of delay circuits, which are identical in construction and formation as the second set of delay circuits 14.

The first set of delay circuits 12 are connected so that the first set of phase outputs oscillate at an oscillation frequency due to the ring coupling of inverse phases (i.e., complementary ø7 connected to ø1). Each of the first set of phase outputs oscillates at a frequency equal to or in proportion to the reference clock frequency (REF_CLK). As such, the first set of delay circuits 12 are attributable to a first PLL 16, which comprises, in addition to circuits 12, phase detector and charge pump 18a, gain circuit 20a, and feedback counter 24. Second PLL 26 includes not only second delay circuits 14, but also phase detector and charge pump 18b, gain circuit 20b, and feedback counters 22,24, and 28. Gain circuit 20a is identical to gain circuit 20b, except that $V_0$ is not brought out from gain circuit 20b.

The difference in phase between ø1 output and the reference clock signal will regulate the output from phase detector 18a as well as the output from gain circuit 20a. If the phase difference is substantial, then the difference between the pair of voltages $V_P'$ and $V_N'$ will be equally substantial. The difference between $V_P'$ and $V_N'$ will trigger either an increase or a decrease in the delay within each of the first set of delay circuits 12 and second set of delay circuits 14. Note that the PLL oscillation frequency is only affected by the increase or decrease in the delay of the first set of delay circuits 12. If the phase angle of, for example, ø1 matches the phase angle of the reference clock, then $V_P'$ and $V_N'$ will be essentially static and unchanging, thereby forcing relatively no further change in delay within each of the delay circuits 12 and delay circuits 14. Thus, oscillator 12 operates as a current-controlled oscillator ("ICO") typical of PLL architectures where the input control voltage designated as V0 in actuality represents a control current in each identical delay circuit of either 12 or 14.

In addition to sending a pair of voltages $V_P'$ and $V_N'$ to regulate the oscillation frequency of oscillator 12, gain circuit 20a also sends a fixed control gate voltage $V_O$. These input voltages set branch currents in the delay cell circuits that affect the operating speed or internal delay of the circuit. The voltage $V_O$ will set the nominal delay of delay circuits 12 and delay circuits 14 while the voltage difference between $V_P'$, and $V_N'$ will determine the incremental delay of each delay circuit 12. The difference by which $V_P'$ and $V_N'$ are different will regulate the phase delay of each cell thus establishing the oscillation frequency of oscillator 12. In other words, $V_O$ defines the center frequency of oscillator 12 while the differences in voltages between $V_P'$ and $V_N'$ define the sensitivity or gain of oscillator 12.

Second PLL 26 has a separate and distinct three-input phase detector 18b that operates similar to phase detector 18a, except that pulse edges fed to the inputs of phase detector 18b determine an amount of delay imparted to the linear delay network 30. Linear delay network 30 is shown having three delay circuits, where the amount of delay within each circuit is controlled by a voltage difference between $V_P''$ and $V_N''$. For example, if the voltage difference between $V_P''$ and $V_N''$ is significant, then based upon the polarity of this difference more or less delay is placed into network 30.

Because the three-input phase detector 18b receives sampled-phase feedback information from one of the second set of delay circuits 14, and feedback phase information from two of the first set of delay circuits 12, a relative phase comparison can be made and control can be invoked to ensure the phase output within the second set of delay circuits (ø2) is properly placed between a pair of phase outputs from the first set of delay circuits (ø1 and ø3). Controlling ø2 relative to ø1 and ø3 takes place within the second phase detector 18b, gain circuit 20b, and delay network 30.

It is recognized that although an 8-phase clock generation circuit 10 is shown, in actuality 16 phase output is shown depending on whether a tap is taken from the normal or complementary (differential) output of each delay circuit within the first and second sets of delay circuits. It is also important to note that the linear delay is set at an integer value plus 0.5, so that ø6 is placed at a phase angle preferably in the middle between ø5 and ø7, ø8 is placed at a phase angle preferably in the middle between ø7 and ø1 ø2 is placed at a phase angle preferably in the middle between ø1 and ø3, and ø4 is placed at a phase angle preferably in the middle between ø3 and ø5.

It is to be appreciated that while FIG. 1 illustrates 8 or 16 phase outputs, more or less than 8 or 16 phase outputs can be achieved, and that the architecture shown in FIG. 1 is provided merely as an example. Moreover, the outputs of each and every one of the first and second sets of delay circuits need not be tapped and, accordingly, albeit 8 or 16 phases can be generated, fewer than 8 or fewer than 16 outputs can be used, if desired. In addition, feedback counters 22, 24, and 28 are optional. Counters 22, 24, and 28 are used if it is desired that first and second sets of delay circuits operate at a frequency higher than the reference clock frequency. Also, feedback counters 22, 24, and 28 enable lower speed operation in the phase detection and charge pump circuits whose maximum useable bandwidth may be inhibited by semiconductor fabrication process constraints. In this fashion, if N is equal to 10, then a 100 MHz reference clock will impart a 1 GHz oscillation frequency within the first set of delay circuits 12. Note that if in a design it is possible to interleave four additional phases from a second PLL with respect to four phases from a first PLL then the effective sampling rate can be very high (in this case 8 Ghz to 16 GHz). The previous example demonstrates the power and advantage of such designs and why the prior art has used multi-phase PLLs in the past. It is important to realize that this invention permits its continued use at much higher clock frequency speeds. In addition, greater timing margin is provided on tap delays if the oscillator resonant frequency is reduced. Further details of the phase detectors 18, gain circuits 20, and delay circuits 12 and 14 will be provided herein below.

Figure 2:
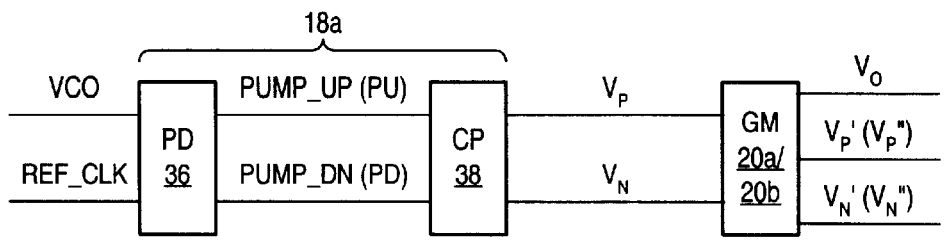
FIG. 2 is a block diagram of the phase/frequency detector, charge pump and gain control circuit of a first and second phase-locked loops used to generate the respective first phase outputs and, through linear delay, the second phase outputs.

Referring to FIG. 2, phase detector and charge pump 18a are broken into separate blocks, illustrating phase detector 36 receiving one input from the oscillator clock output marked "VCO" and one input from the reference clock (REF_CLK). Depending on whether the reference clock exceeds the phase and frequency of the oscillator, either a pump up or pump down signal will dominate. For example, if the oscillator lags in phase relative to the reference clock, then a pump up pulse will exceed in duration relative to a pump down pulse. The pump up (PU) and pump down (PD) signals drive a charge pump 38, which will then produce corresponding $V_P$ and $V_N$ signals across a connected loop filter with this voltage difference used to control the gain circuit 20a/20b.

Although the phase detector will differ depending on whether it is a two-input phase detector or a three-input phase detector (18a or 18b), the gain circuit and charge pump overall architecture remains the same regardless of whether a two-or three-input phase detector is used. Thus, charge pump 38 and gain circuit 20a are the same regardless of whether it is within the first PLL 16 or second PLL 26. If in the first PLL 16, then gain circuit 20a produces voltage pairs $V_P'$ and $V_N'$. However, if in the second PLL 26, gain circuit corresponds to gain circuit 20b, and the voltage pairs being produced are $V_P''$ and $V_N''$.

Figure 3:
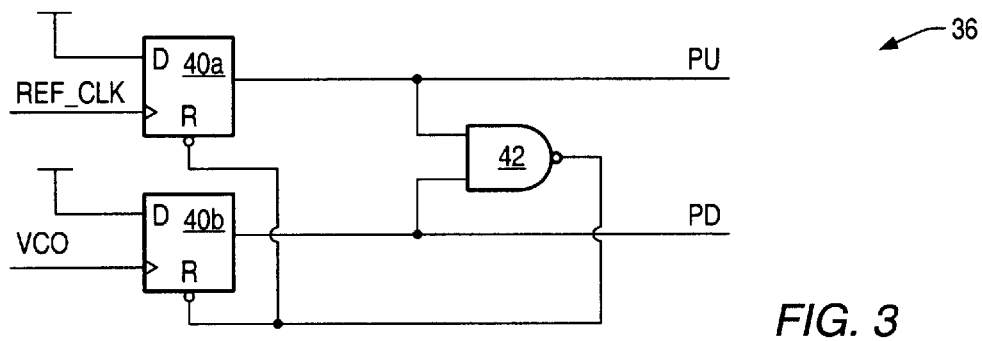
FIG. 3 is a circuit diagram of the phase/frequency detector of FIG. 2, according to one example.

FIG. 3 illustrates one example by which the two input phase detector 36 can be formed. According to the example shown, phase detector 36 includes a pair of flip-flops 40a and 40b. In addition, phase detector 36 includes a logic gate, such as a NAND gate 42 having a pair of inputs connected to the outputs of flip-flops 40. The D-inputs can be tied to a high logic value and the flip-flops 40 can be clocked by the reference clock and the oscillator output. The first pulse to occur between either the reference clock pulse or the oscillator pulse will register a logic high voltage value on either the pump up or pump down outputs. Once the second pulse leading edge arrives, the other output will receive a logic high voltage value and, depending on the propagation delay within logic gate 42, a reset signal will emanate from logic gate 42 thereby resetting the outputs of flip-flops 40 to an in-active logic low voltage value.

For example, if the reference clock is faster than the oscillator output, then the leading edge of a reference clock pulse will arrive upon flip-flop 40a before the oscillator leading edge pulse will arrive on flip-flop 40b. Thus, the duration of the pump up pulse will exceed the duration of the pump down pulse. When placed through the PLL feedback mechanism, the pump up pulse will then be fed into a charge pump, which will then cause the oscillator to speed up so that, eventually, the oscillator output leading edge will match (i.e., "lock to") the reference clock leading edge. If, on the contrary, the pump down duration exceeds the pump up duration, then the charge pump will cause the oscillator to slow down so that the oscillator leading edge will match in duration and time phase the reference clock leading edge. Phase detector 36 thereby detects sampled phase differences between edges of the reference clock and the oscillator output and, according to feedback control theory, will speed up the delayed edge to match in phase the other pulse (either the reference clock pulse or the VCO pulse).

Figure 4:
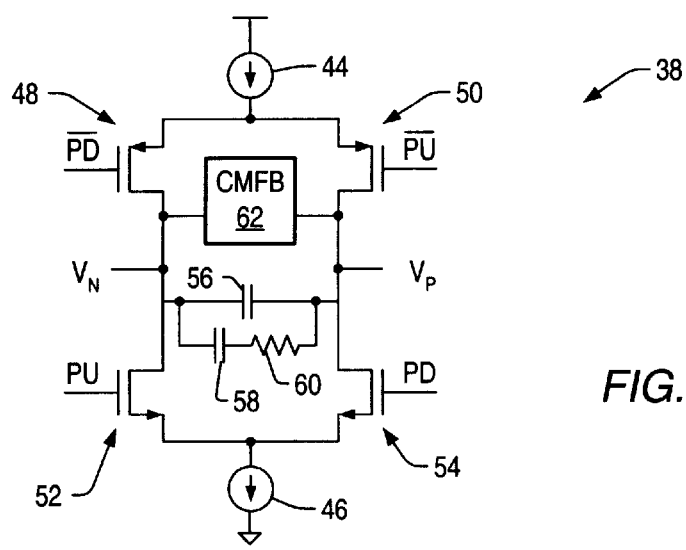
FIG. 4 is a circuit diagram of the charge pump of FIG. 2, according to one example.

FIG. 4 illustrates one form of charge pump. Similar to FIG. 3, charge pump 38 shown in FIG. 4 is only one example of numerous ways in which a charge pump can be implemented. Charge pump 38 is shown according to the illustrated example as having two current sources 44 and 46 connected to corresponding power supplies. Charge pump 38 is also shown to include a set of p-channel switching transistors 48 and 50, as well as a set of n-channel switching transistors 52 and 54. The transistors are shown as complimentary metal-on-oxide silicon ("CMOS") transistors, however, it is appreciated that the transistors used in these architectures and circuits can be constructed from multiple process technologies, including silicon-germanium, bipolar, BI-CMOS (Bipolar-CMOS), CMOS silicon-on-insulator (CMOS-SOI), etc. If, for example, the pump up pulse duration exceeds the phase down pulse duration, then transistors 50 and 52 will stay on longer than transistors 48 and 54. During times when both the pump up and pump down pulses are present, then current from source 44 will flow in shunt fashion directly to current source 46 down each of the conductive paths formed by transistors 48–54. However, if pump up remains an active voltage value and pump down turns off, then the current path will form through transistor 50 and 52, but not through transistors 48 and 54. This will cause a bridging effect and will essentially apply charge to the shunting capacitor 56, and the series connected capacitor 58 and resistor 60. Elements 56–60 form a low-pass filter, and common mode feedback ("CMFB") device 62 ensures the common-mode voltages on $V_N$ and $V_P$ are theoretically equal except for the differential charge supplied through the bridging operation. Thus, the duration of the difference between the longer pump up pulse versus the pump down pulse will cause a voltage differential between $V_N$ and $V_P$ that is stored, of course, by the low-pass filter elements 56–60. If the relative duration differences are excessive, then the voltage differences will also increase or decrease accordingly. However, if the duration becomes fairly insignificant, so will the time varying voltage differences between $V_N$ and $V_P$. Note that the final voltage difference between $V_N$ and $V_P$ does not have to equal zero as long as their final value is static. The low-pass filter elements 56–60 and the CMFB unit 62 thereby suffice as a differential integrator which averages the voltage differential to account for continuous feedback operation according to conventional phase-locked loop design and control system theory.

Figure 5:
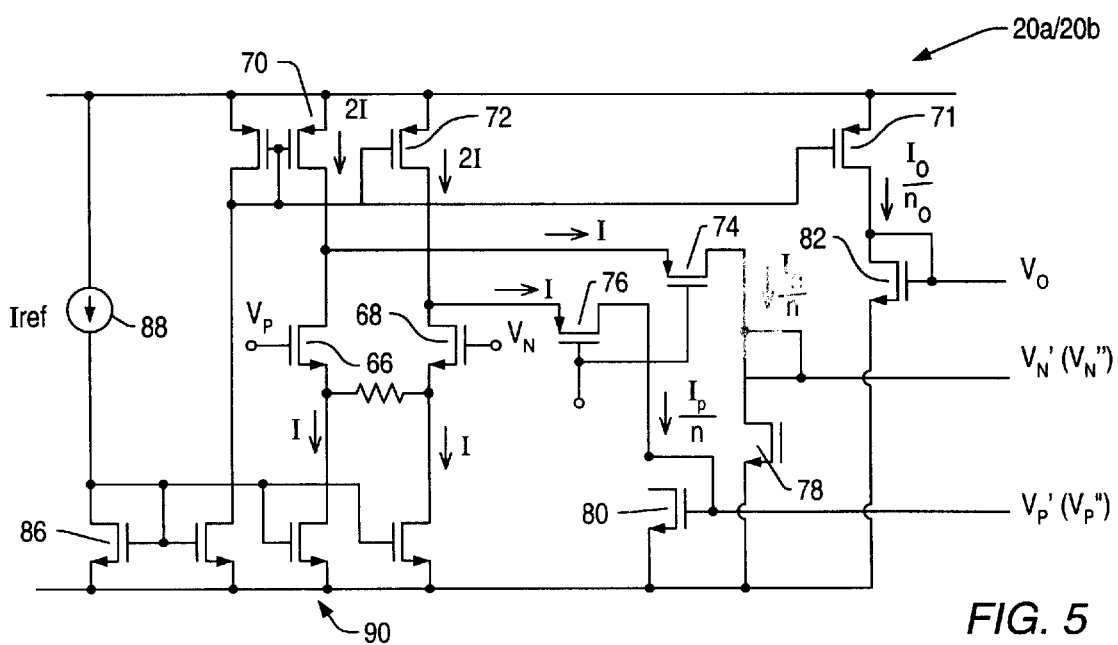
FIG. 5 is a circuit diagram of the gain control circuit of FIG. 2, according to one example.

FIG. 5 illustrates a gain circuit 20a or 20b, which are identical in both architecture and function. Gain circuit 20 receives the differential voltage values $V_P$ and $V_N$ from charge pump 38 upon transistors 66 and 68. By design, if $V_P$ equals $V_N$, about a high enough common-mode voltage, then transistors 66 and 68 will both be in saturation. This will cause the current from current sources 70 and 72 to traverse not only the conductive paths of transistors 66 and 68, but also the conductive paths of transistors 74 and 76, as well as transistors 78 and 80. If, however, the $V_P$ exceeds $V_N$, then transistor 66 will form a lower conductive path therein which will shunt more current away from transistors 74 and 78 relative to the current within transistors 76 and 80. This will decrease $V_N'$. Correspondingly, if $V_N$ is increased relative to $V_P$, then more current will be shunted away from transistors 76 and 80, thereby decreasing $V_P'$.

The gain circuit 20 represents a transconductance gain that translates the input differential voltage of $V_P$ and $V_N$ to the diode-connected transistors 80 and 78 in the form of drain current. When connected to similar matching transistors each additional transistor connected to the gate voltages of either $V_P'$ or $V_N'$ will command the identical drain current due to the fact of their gate voltages being equal. Depending on whether gain control circuit 20 is used at the output of a two-input phase detector or a three-input phase detector, either $V_N'/V_P'$ (two-input) or $V_N''/V_P''$ (three-input) are envisioned. While the gain control circuit is the same in either embodiment, only the output is designated to be different depending on whether a three-input phase detector or a two-input phase detector is used. The primary purpose, however, of the gain control circuit 20 is to provide gain control and voltage differential between $V_O$, $V_N'/V_N''$, and $V_P'V_P''$.

Current scaling is used to increase the circuit current biasing from reference input 88 throughout the gain circuit using current mirroring techniques. By connecting additional transistors to the established gate voltages, larger currents can be generated elsewhere in the overall circuit at specific circuit branches. By sinking the available input reference bias current, Iref 88, diode connected transistor 86 establishes a constant gate voltage. Additional NMOS transistors 90 that connect to the gate of transistor 86 increase their drain current to a value of I as shown. The reference current 88 can also be folded-up and increased to PMOS transistors 70, 72, and 71 using a current mirror circuit. Thus the gate voltage on transistor 88 is connected to constant current biasing transistors 90 that sink a much larger current of value I. In addition, the constant gate-to-source voltage on constant current biasing PMOS transistors 70, 72, and 71 are shown at an increased value of 21 and $I_0/n_0$. Finally, diode connected transistor 82 sinks a constant current $I_0/n_0$ that establishes gate voltage $V_O$. The absolute magnitude and relative values of the currents in transistors 70 and 72 (21), and transistors 90 (I), do not need to be in a strict ratio of two to one. For clarity, the circuit diagram only shows that a residual current of I is folded out to transistors 74 and 76 at the nominally biased operating point in the circuit. This nominal condition is when input voltages $V_P$ and $V_N$ are equal with the currents through each transistor 66 and 68 having a value of I. It is preferred to keep the current Iref 88 a small fraction of the other biasing transistors in the circuit for power and size reduction.

The primary purpose of the transconductance gain control 20 is to provide a conversion between the differential loop filter voltage $V_P$-$V_N$ and output current. The diode connected transistors 78, 80 and 82 will establish equal or scaled currents in the delay cells due to the fact that the gate voltages $V_N'$ ($V_N''$), $V_P'(V_P'')$ and $V_O$ connect to specific nodes in each identical delay cell circuit 12 and 14.

Figure 6:
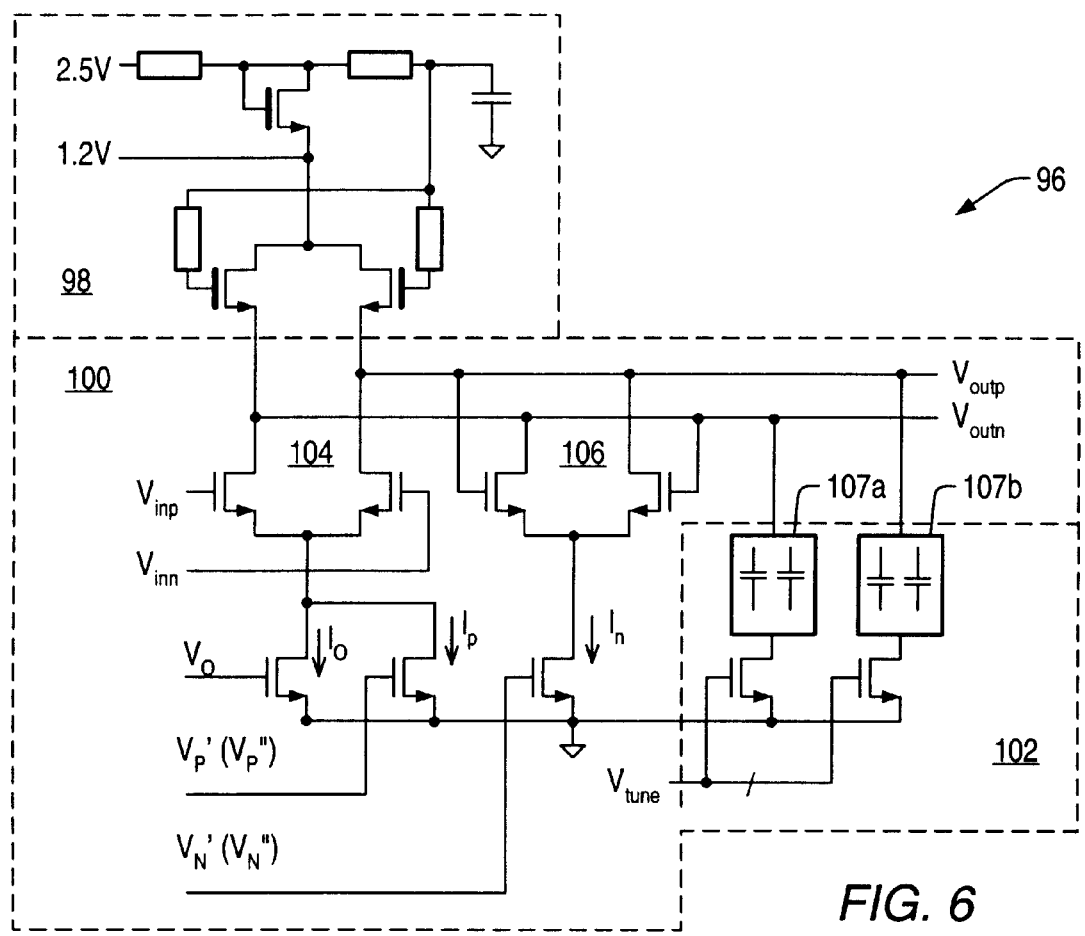
FIG. 6 is a circuit diagram of the delay circuit of FIG. 1, according to one example.
Figure 7:
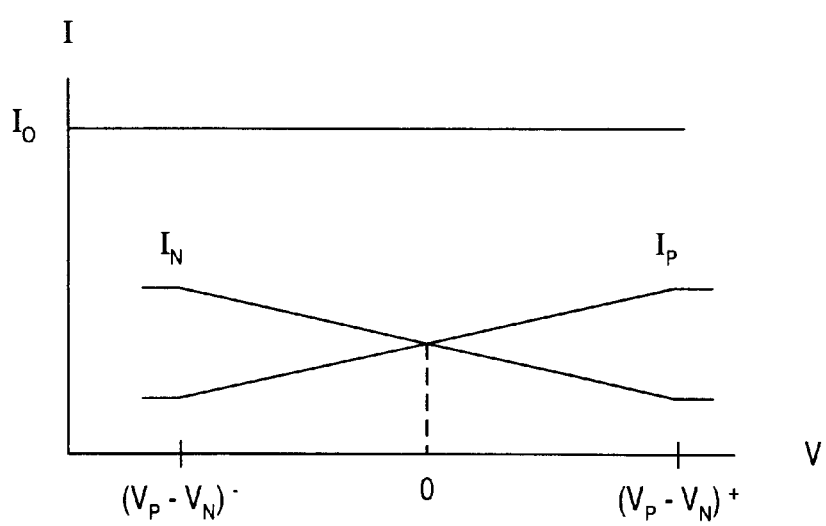
FIG. 7 is a graph of current versus voltage (i.e., $V_P'$ minus $V_N'$, or $V_P''$ minus $V_N''$), and the relative delay differential between $I_P$ and $I_N$ achievable within certain delay circuits of FIG. 1 which, when combined with other delay circuits having a delay, forms an overall linear delay of approximately x.5, where x equals an integer value.

FIG. 6 illustrates a delay circuit 96, such as a delay circuit used in the first set of delay circuits 12 or the second set of delay circuits 14. Delay circuit 96 is preferably the same, and is used as the basic delay circuit in the first and second sets of delay circuits. Delay circuit 96 includes a load circuit portion 98, a delay circuit portion 100, and a tune circuit portion 102. Delay circuit portion 100 receives the inputs from the driving delay circuit as $V_{inp}$ and $V_{inn}$. The delay circuit has a nominal delay due to the contribution of transistors pairs 104 and 106 that steer currents $I_o$, $I_P$ and $I_n$ through the load impedances represented by 98 and 102. As shown in FIG. 7, an average pump up duration exceeding an average pump down duration will cause $V_P'$ to exceed $V_N'$.

In addition, the amount of delay within delay portion 100 introduced between $V_{inp}/V_{inn}$ and $V_{outp}/V_{outn}$ is controlled by the differential voltages within $V_P'$ and $V_N'$ or, in the case of the second PLL, $V_P''$ and $V_N''$. $V_O$ remains fixed and substantially larger than $V_P'/V_P''$ and $V_P''/V_N''$. If, however, $V_P'$ is greater than $V_N'$, then $I_P$ will exceed In. This will cause the majority of current to flow through the first differential pair of transistors 104, rather than the second differential pair of transistors 106.

Transistor pairs 104 and 106 essentially operate as differential amplifiers, which amplify the input voltages $V_{inp}$ and $V_{inn}$, onto the output load impedance to form $V_{outp}$ and $V_{outn}$. However, if the majority of the available differential control current is within the first differential amplifier 104, then less delay will occur than if the majority of current were in the second differential amplifier. In all instances, $I_P$ and $I_n$, combine to form a fixed current. However, depending on the voltage differential of $V_P'$ and $V_N'$, $I_P$ and $I_n$ will be different. Importantly, however, if $I_P$ equals In, then the delay circuit 96 will be balanced, indicated by a nominal delay. However, if $V_P'$ exceeds $V_N'$ and, therefore, $I_P$ exceeds In, then amplifier 104 will turn on more quickly to induce less delay within circuit 96. Conversely, if $V_N'$ exceeds $V_P'$, thereby In exceeds $I_P$, then amplifier 106 will turn on a delayed time after amplifier 104 turns on, the net effect of which is to delay the outputs of $V_{outp}$ and $V_{outn}$.

As shown in FIG. 7, a pump up duration exceeding a pump down duration may cause $V_P'$ to exceed $V_N'$, in which case $I_P$ will exceed In to indicate a "fast" operation of delay circuit 96. The inverse is true if the pump down average pulse duration exceeds the pump up average pulse duration, thereby causing the delay circuit 96 to "slow" its operation.

Referring again to FIG. 6, it may be necessary based on process variations, that the output voltages be tuned. A field of binary logic values can be entered onto multiple control signal lines, signified as $V_{tune}$. The binary field selects one or more parallel-connected capacitors arranged within banks 107. For example, a three-capacitor bank 107 can be selected with three bits, such that a binary code of 7 can connect three capacitors to each conductor bearing $V_{outp}$ and $V_{outn}$. A binary code of 7 will thereby place an increased capacitive load on the output voltage nodes than would a binary code of, for example, 1, which only places one capacitive element on the output conductors. Being able to tune the output voltages based on lot-to-lot process variations provides an additional level of flexibility to the overall delay circuit 96.

Figure 8:
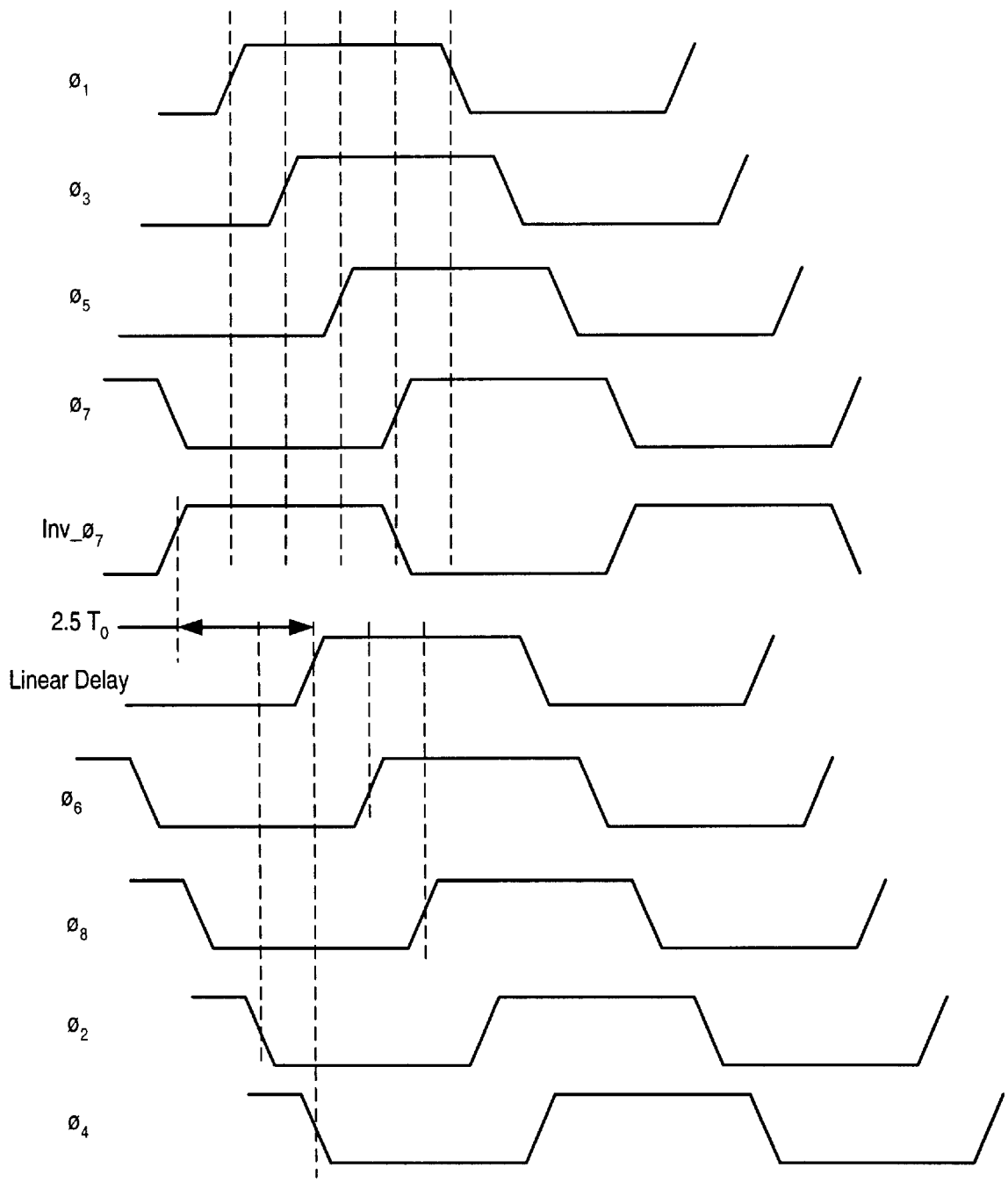
FIG. 8 is a timing diagram of phase outputs from the first set of delay circuits interleaved with phase outputs from the second set of delay circuits to form at least 2N phase outputs from an oscillator having only N phase outputs.

Turning to FIG. 8, a timing diagram is shown illustrating phase delays attributable to various phase outputs from the first and second sets of delay circuits shown in FIG. 1. Referring to FIGS. 1 and 8 in combination, ø3 is delayed a predefined amount from ø1), and ø5 is delayed from ø3. Additionally, ø7 output is delayed from ø5, and so forth to complete the four phase output from oscillator 12 (and eight phase output from the PLL circuit 10) of FIG. 1.

In the example of FIG. 8, a linear delay is imparted within a linear delay network 30, shown in FIG. 1, where the integer value x=2. In the example of FIG. 8, the complementary ø4 output is delayed by 2.5 To (where $T_O$ equals the ring oscillator period) from the phase of the complementary ø7 (Inv_ø7) leading edge pulse. The rising edge phase output from the delay circuit which produces ø6 will occur one delay amount after 2.5 delays from a leading edge of complementary ø7 (Inv_ø7), and thereafter, and so forth for ø8, ø2, and ø4, all being the phase outputs from the second set of delay circuits.

As shown in FIG. 8, the complementary phase output to ø2 is significant. Referring to FIGS. 1 and 8, complementary phase output of ø2 is utilized, along with the ø1 and ø3 outputs. As shown, the complementary ø2 output is by nature directly between the ø1 output and ø3 output. In fact, ideally, the complementary ø2 output (represented as a trailing edge) is between the ø1 leading edge and ø3 leading edge and, preferably, at a midpoint between those edges. Thus, imparting a x.5 linear delay will achieve a complementary ø2 output at a midpoint between ø1 output and ø3 output. This relationship will be utilized by the three-input phase detector 18b, as described in FIG. 9.

Figure 9:
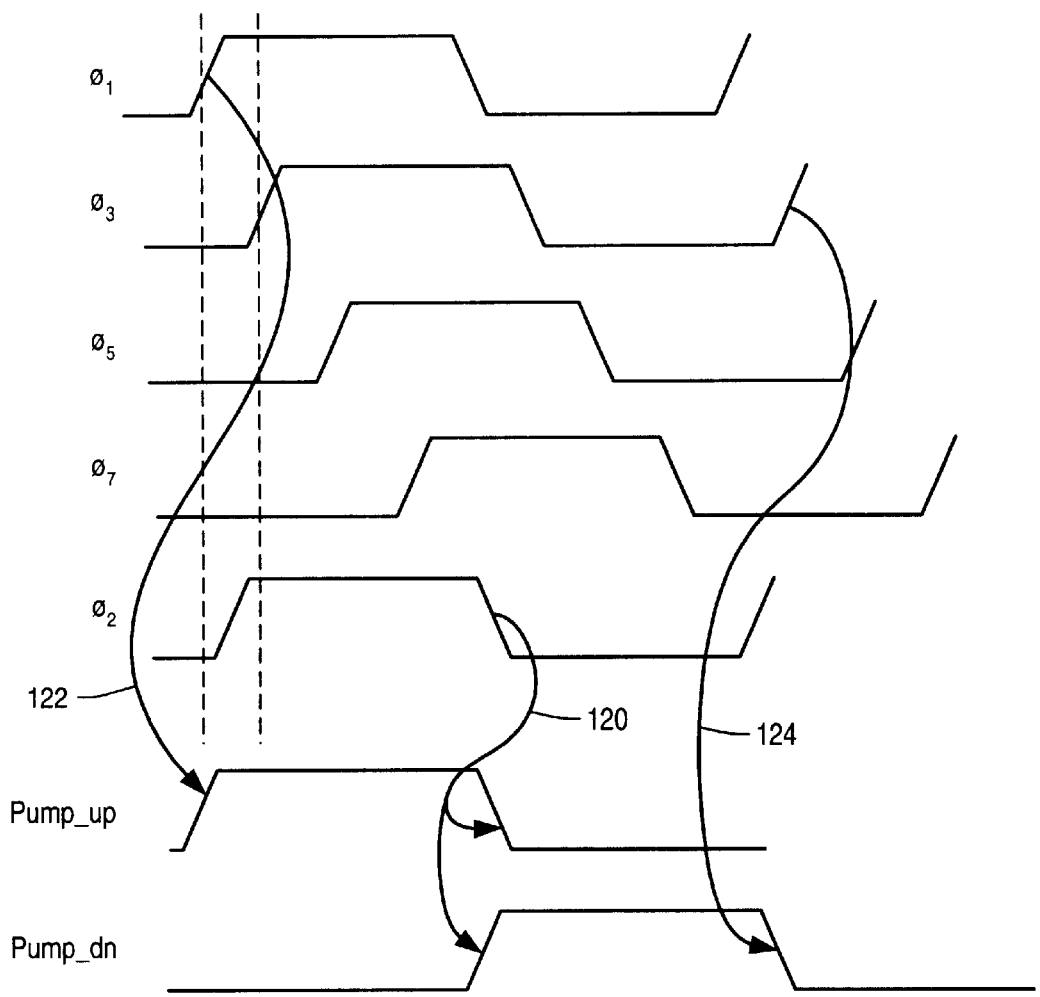
FIG. 9 is a timing diagram of trailing edge of interleaved phase two (ø2) output relative to the leading edge of phase one (ø1) and the next leading edge of phase three (ø3) being used to determine the pump_up (PU) and pump_down (PD) time durations output from the tri-input phase detector of the second phase-locked loop of FIG. 1.

Referring to FIG. 9, placement of the complementary ø2 output between ø1 and ø3 outputs ensures that an edge 120 will be directly between a leading edge of ø1 output 122 and a leading edge of the next ø3 output 124. This occurs, however, only if pro er delays are achieved within the delay circuits of the linear delay network 30, shown in FIG. 1. If the complementary ø2 output does not occur between ø1 and ø3 , then a pump up or pump down pulse will become predominant from the output of the triple input phase detector 18b, shown in FIG. 1. Through feedback and normal delay operations, the pair of voltages $V_P$" and $V_N$" will eventually settle to a value that sets the linear delay within network 30 to produce a complementary ø2 output between ø1 and ø3 , thereby causing the pump up duration to equal the pump down duration. FIG. 9 illustrates the timing operation of the three-input phase detector used in the second PLL and labeled 18b.

Figure 10:
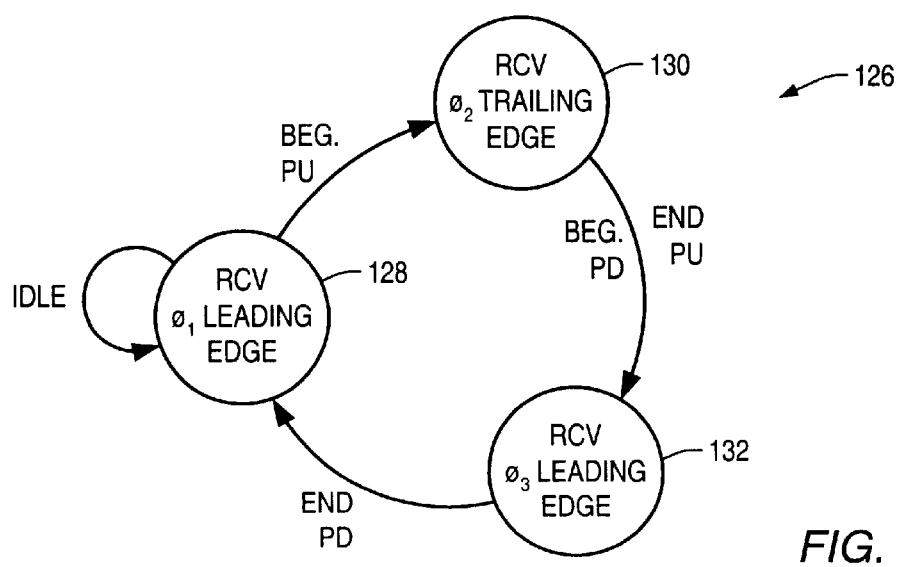
FIG. 10 is a state diagram of the tri-input phase detector operation of FIG. 1.

FIG. 10 illustrates a state diagram 126 of the three-input phase detector operation. Upon receiving the leading edge of ø1 output, the three-input phase detector will begin a pump up operation, as shown by state 128. Thereafter, the three-input phase detector will receive the trailing edge of the ø2 output 130, thereby signifying the end of the pump up pulse and the beginning of a pump down pulse. Upon receiving a leading edge of the ø3 output, the pump down pulse is terminated, as shown by state 132. FIG. 10 is, therefore, illustrative of the states under which the pump up and pump down pulses are created.

Because all of the phase outputs occur at the same frequency, placing the complementary ø2 output between ø1 and ø3 will ensure that the trailing edge of ø2 will be between the leading edge of ø1 and the subsequent leading edge of ø3. This is, of course, assuming that the PLLs are substantially locked. What is meant by a locked condition, when considering the fact that PLLs are used, is that the complementary ø2 output is locked in phase between the ø1 output and the ø3 output. If regularly spaced phases are to be achieved, where the second set of delay circuits are producing phases interleaved with the first set of phase outputs, then ideally the complementary ø2 output is spaced equi-distance in time between ø1 and ø3. This means that, when the PLLs are locked, the linear delay network is always an integer multiple plus 0.5 of the delay time attributable to each delay circuit.

Figure 11:
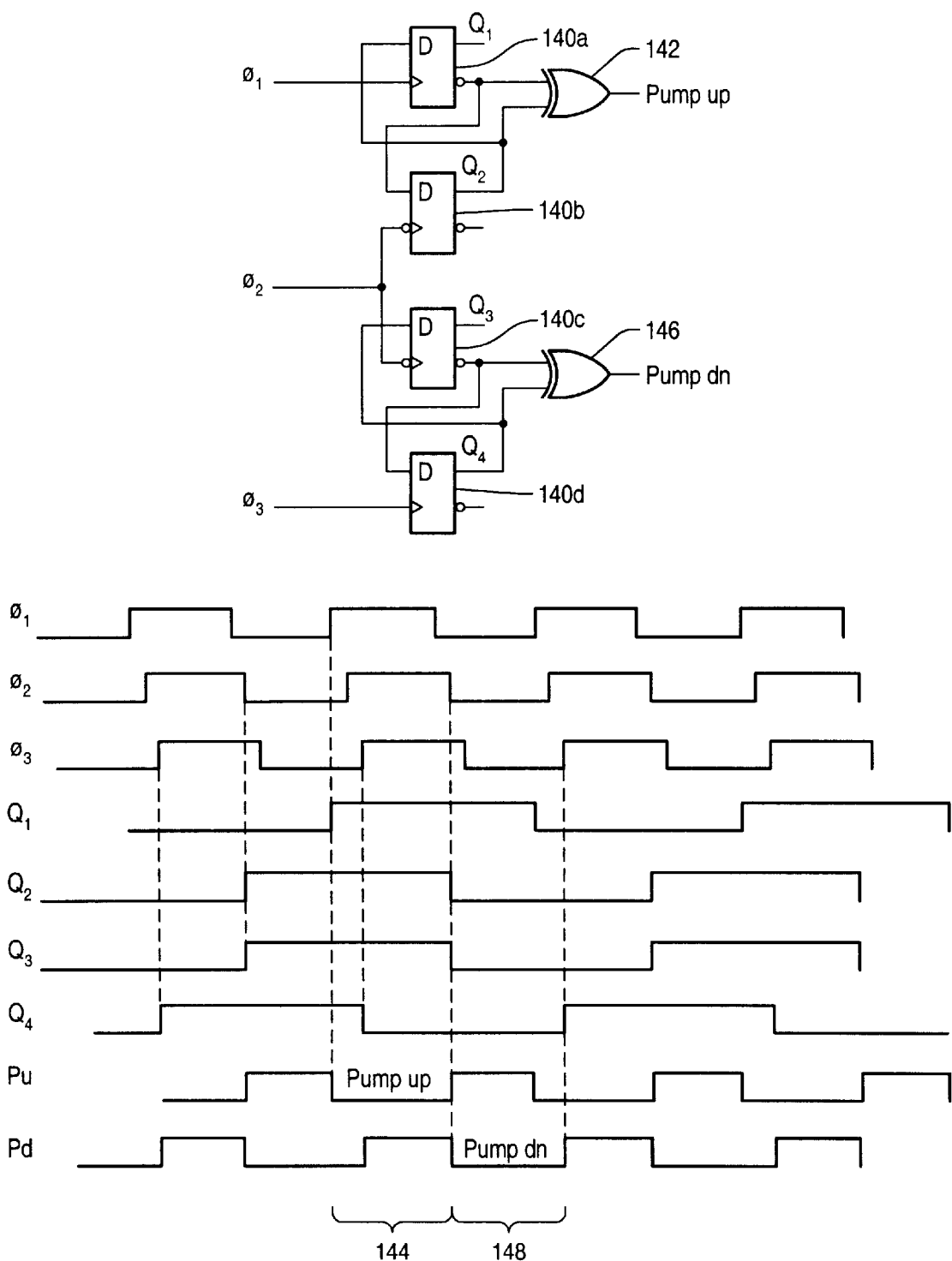
FIG. 11 is a circuit diagram and timing diagram of the tri-input phase detector of FIG. 1, according to one example.
Figure 12:
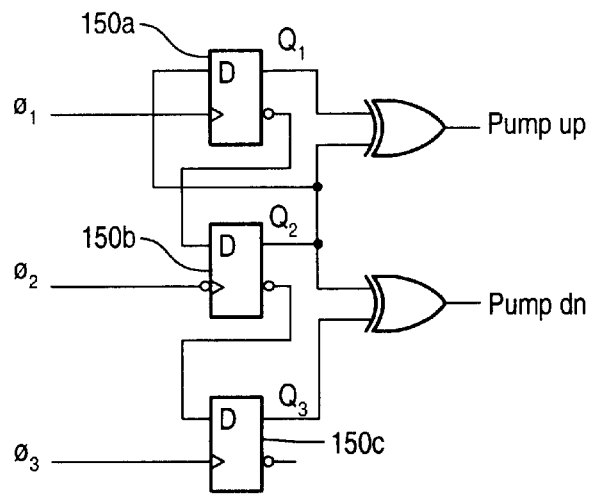
FIG. 12 is a circuit diagram and timing diagram of the tri-input phase detector of FIG. 1, according to another example.
Figure 12:
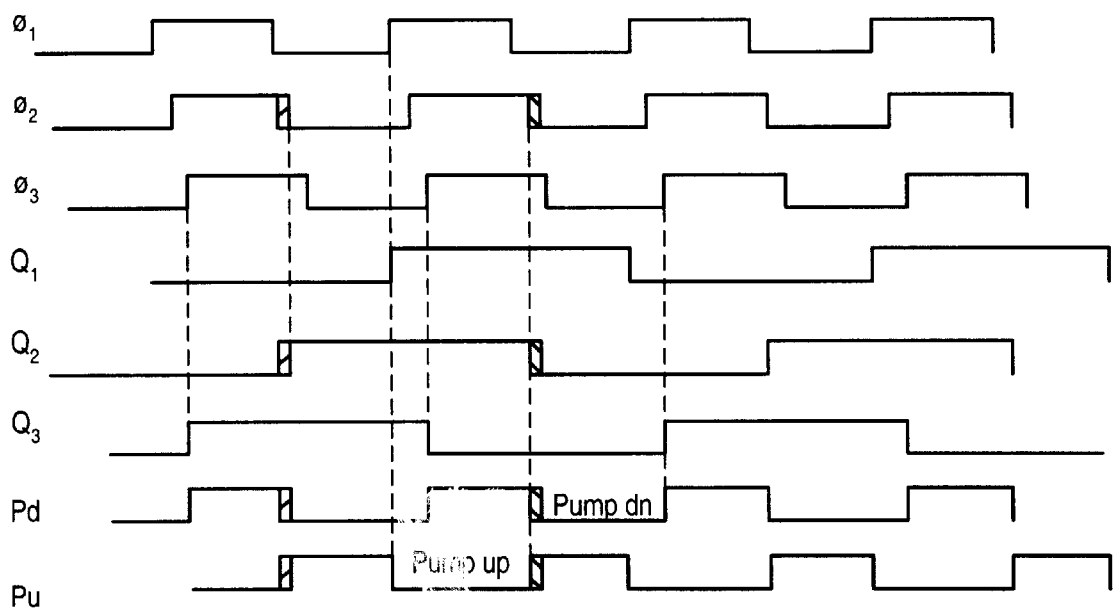

There are various methods in which to achieve a three-input phase detector usable within the second PLL 26 of FIG. 1. The three-input phase detector 18b, shown in FIG. 1, can be implemented using four flip-flops, shown in FIG. 11, or three flip-flops, shown in. FIG. 12. Referring to FIG. 11, flip-flips 140 transition from the leading edges of ø1 and ø3 outputs, and the trailing edges of ø2 output by feeding such phase outputs into the clocking inputs of the corresponding flip-flops 140. In the interim between which the leading edge of ø1 output occurs and the trailing edge of ø2 output occurs, EX OR gate 142 produces a pump up pulse 144. Thereafter, complementary ø2 output remains while ø1 output changes state. Complementary ø2 output remains while ø3 output becomes active, thereby producing a pump down signal from EX OR gate 146 to produce a pump down pulse 148. The process is repeated for each of the periodic cycles of the ø1, ø2, and ø3 outputs.

FIG. 12 illustrates use of only three flip-flops 150. Referring to FIG. 12, flip-flips 150 transition from the leading edges of ø1 and ø3 outputs, and the trailing edges of ø2 output by feeding such phase outputs into the clocking inputs of the corresponding flip-flops 150. In the interim between which the leading edge of ø1 output occurs and the trailing edge of ø2 output occurs, EX OR gate 152 produces a pump up pulse 154. Thereafter, complementary ø2 output remains while ø1 output changes state. Complementary ø2 output remains while ø3 output becomes active, thereby producing a pump down signal from EX OR gate 156 to produce a pump down pulse 158. The process is repeated for each of the periodic cycles of the ø1, ø2, and ø3 outputs. From the timing diagram in FIG. 12, phase output ø2 is shown to have a falling edge uncertainty. This graphical highlight is just for reference since it explicitly shows how the phase variation of this output will transfer to the phase detector outputs by varying the duty cycle of the pump up or pump down outputs. As stated earlier, this duty cycle variation is the key element in obtaining phase alignment between the odd phases ø1, ø3 , ø5, ø7, and the even phases ø2, ø4, ø6, ø8.

The benefit in the three flip-flop approach over the four flip-flop approach is mainly a power savings issue. However note that circuit loading on the three phase input signal lines is different with respect to the ø2 input since the three flip-flop approach presents only one clock input load similar to the other clock phase inputs ø1), and ø3. Thus input loading in the three flip-flop approach is equally balanced since each clock phase input ø1), ø2, and ø3 sees only one latching clock input. Note that in both phase detector designs, the active pump up and active pump down cycle periods are noticeably longer than their inactive periods. This is advantageous from a circuit bandwidth point of view because there is more cycle time or overhead in establishing these error signals.

There are other state machine approaches that can be implemented and these two prior examples are only representative of many ideas that one skilled in the art of circuit design can build to function in the same desired manner as previously stated above. A central theme of the PLL circuit is the generation of 2N output phases synchronized by an input reference clock that requires a VCO needing only N stages or N phase outputs. This VCO is under frequency lock control, allowing a VCO differential phase to run through a linear delay element outside the VCO oscillating ring network. The delayed phase caused by the linear delay network is brought under phase-locked loop control by the second PLL and presents, in one example, a delay extension of 2.5 times the nominal delay ($T_0$) of one delay cell that contributes to the total VCO oscillation period ($f_{osc}=1/(2\ NT_0)$). In the example shown in FIG. 1, three delay elements in series presents less requirements on the linear range of each delay circuit within the network 30. In this case, each delay circuit only needs an inherent delay of 0.833 To (i.e., 3 x 0.833 equals approximately 2.5). In addition, having each delay circuit contribute a smaller percentage of the total delay period enables the linear delay network gain to decrease. This translates to lower VCO gain while generating less overall PLL jitter. The VCO gain specification has to be controlled by design just as any other PLL design to have the proper tuning range over process.

Of benefit to the present design is the control of incremental delay within a second set of delay circuits relative to a first set of delay circuits using differential signal edges in a PLL feedback system, and not by using analog signal amplitudes as done in many conventional interpolation schemes. Each delay circuit tracks one another within temperature and process, and the three-input phase detector responds to phase differences and applies linear feedback similar to a clock data recovery loop. Higher oscillation frequencies are achieved because the oscillator has only one-half the delay circuits of a comparable ring oscillator with the same number of output phase taps. Frequency tuning is done more reliably and capacitor selection that sets the center frequency is larger and more dominant than loading parasitics. Incremental delay is set by a dedicated second PLL that uses divided down clock signals that are easier to use for purposes of control. The delay of each phase output in the first set of delay circuits attributable to the oscillator is directly varied with negligible change in the gain or voltage swings.

The delay circuits are beneficially designed to achieve constant current through the load in order to obtain uniform output voltage levels. The current differences between $I_P$ minus $I_n$ determines the linear delay. Importantly, $I_P$ plus $I_n$ is substantially constant even though one might be considerably larger than the other if, indeed, lock condition has not yet been met. Active inductive loads will increase the transistor delay bandwidth and switched binary-weighted load capacitance on the output nodes can control the center or operating point delay. The switching or variable delay characteristic can be tuned using binarily weighted capacitor values that are selected digitally using a binary code to increase or decrease the circuit path propagation delay time. This tuning mechanism will overcome process variations in forming the delay cells.

It will be appreciated to those skilled in art having the benefit of this disclosure that the embodiments described herein are applicable to any clock generation circuit from which multiple phases can be obtained. While the present circuit is noted as a clock generation circuit, a clock need not be generated and, instead, the present circuit is intended simply to generate a multi-phase signal that need not be used as a clocking signal. The number of phase outputs are not limited to the examples shown and, certainly, more than 8/16 or less than 8/16 phase outputs can be achieved. Moreover, one skilled in the art would appreciate that, after reading this disclosure, the phase detector, charge pump, and gain circuitry can be derived using slightly different architectures and schematics than those shown provided, of course, the outcome is consistent with that which is described herein. Accordingly, the specification and drawings are to be regarded in an illustrative rather than a restrictive sense as to possibly numerous variations that fall within the spirit and scope of the present embodiments.

What is claimed is:

1. A clock generation circuit, comprising:
   an oscillator having a first set of N phase outputs; and
   a set of delay circuits having a second set of N phase outputs separate from yet interleaved with the first set of phase outputs.

2. The clock generation circuit as recited in claim 1, wherein the first set of phase outputs comprise a first signal that immediately precedes a second signal in phase, and wherein the second set of phase outputs comprise a third signal having a single phase that is between the first signal and the second signal in phase.

3. The clock generation circuit as recited in claim 1, wherein the phase of the third signal is substantially equidistant in phase between the phases of the first signal and the second signal.

4. The clock generation circuit as recited in claim 1, wherein a pre-determined number of the second set of phase outputs are interleaved with a pre-determined number of the first set of phase outputs.

5. The clock generation circuit as recited in claim 1, further comprising a first phase-locked loop adapted to produce a pair of voltages input to the oscillator for setting a frequency of the oscillator.

6. The clock generation circuit as recited in claim 1, further comprising a second phase-locked loop adapted to produce a pair of voltages input to a linear network for delaying the second set of phase outputs connected to an output of the network dependent on a difference in the pair of voltages.

7. The clock generation circuit as recited in claim 6, wherein the amount by which the linear delay network delays the second set of phase outputs is a fixed percentage of a frequency of the oscillator.

8. The clock generation circuit as recited in claim 1, further comprising:
   a first phase detector;
   a second phase detector;
   a first frequency divider network coupled between the oscillator and the first phase detector for reducing the frequency of the oscillator relative to the first phase detector; and
   a second frequency divider network coupled between the second set of delay circuits and the second phase detector for reducing the frequency of the set of delay circuits relative to the second phase detector.

9. A multi-phase PLL circuit, comprising:
   a first set of delay circuits coupled in a ring and adapted to receive a first pair of differential voltages for setting an oscillation frequency of the ring; and
   a phase-locked loop adapted to produce a second pair of differential voltages for incrementally delaying phase outputs from a second set of delay circuits such that successive phase outputs from the first set of delay circuits are placed between neighboring successive pairs of phase outputs from the second set of delay circuit.

10. The multi-phase PLL circuit as recited in claim 9, wherein the second pair of differential voltages incrementally delays phase outputs from the second set of delay circuits dependent on an amount of difference between the second pair of differential voltages.

11. The multi-phase PLL circuit as recited in claim 9, wherein each of the first set of delay circuits and the second set of the delay circuits are adapted to produce substantially the same phase delay amount.

12. The multi-phase PLL circuit as recited in claim 9, further comprising a linear delay element coupled to receive the second pair differential voltages for producing a linear delay from one of the second set of delay circuits that is between a successive pair of outputs from the first set of delay circuits.

13. The multi-phase PLL circuit as recited in claim 9, further comprising a first phase-locked loop coupled to receive a reference clock and to produce the first pair of differential voltages having a voltage difference dependent on a difference in frequency between the oscillation frequency and the frequency of the reference clock.

14. The multi-phase PLL circuit as recited in claim 9, wherein the second pair of differential voltages have a voltage difference dependent on a difference in phase between an output of the second set of delay circuits and a pair of outputs of the first set of delay circuits.

15. The multi-phase PLL circuit as recited in claim 14, wherein the voltage difference is substantially zero if the phase of the output of the second set of delay circuits is equi-distant in phase between the pair of outputs of the first set of delay circuits.

16. A method for producing a signal having a plurality of phases, comprising:
    producing a first set of phase outputs spaced by a first phase amount;
    delaying a second set of phase outputs approximately one half the first phase amount and interspersing each of the second set of phase outputs between corresponding pairs of the first set of phase outputs.

17. The method as recited in claim 16, wherein said producing and delaying comprises forming said plurality of phases that comprise the first and second phase outputs.

18. The method as recited in claim 16, wherein said producing comprises linking the first set of phase outputs in succession within a ring to form an oscillator.

19. The method as recited in claim 16, wherein said delaying comprises delaying the second set of phase outputs an integer plus one half the first phase amount.

* * * * *

UNITED STATES PATENT AND TRADEMARK OFFICE
CERTIFICATE OF CORRECTION

PATENT NO. : 6,657,466 B1
DATED : December 2, 2003
INVENTOR(S) : Sudjian

It is certified that error appears in the above-identified patent and that said Letters Patent is hereby corrected as shown below:

<u>Column 14,</u>
Line 65, please delete "circuit" and substitute therefor -- circuits --.

Signed and Sealed this

Sixth Day of April, 2004

JON W. DUDAS
*Acting Director of the United States Patent and Trademark Office*